(12) United States Patent
Ramakrishnan et al.

(10) Patent No.: US 9,184,762 B2
(45) Date of Patent: Nov. 10, 2015

(54) MISMATCH PROFILE

(71) Applicant: TEXAS INSTRUMENTS INCORPORATED, Dallas, TX (US)

(72) Inventors: Sthanunathan Ramakrishnan, Karnataka (IN); Sashidharan Venkatraman, Karnataka (IN); Sreenath Narayanan Potty, Kerala (IN); Sunil Chomal, Karnataka (IN); Nagarajan Viswanathan, Karnataka (IN); Jawaharlal Tangudu, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/656,205

(22) Filed: Mar. 12, 2015

(65) Prior Publication Data
US 2015/0263753 A1 Sep. 17, 2015

(30) Foreign Application Priority Data

Mar. 13, 2014 (IN) ............................ 1336/CHE/2014

(51) Int. Cl.
*H03M 1/10* (2006.01)
*H03M 1/36* (2006.01)
*H03M 1/08* (2006.01)
*H03M 1/06* (2006.01)
*H03M 1/12* (2006.01)

(52) U.S. Cl.
CPC ................ *H03M 1/368* (2013.01); *H03M 1/06* (2013.01); *H03M 1/0836* (2013.01); *H03M 1/121* (2013.01)

(58) Field of Classification Search
CPC ....... H03M 1/06; H03M 1/12; H03M 1/1206; H03M 1/121
USPC .......................................... 341/118, 120, 155
See application file for complete search history.

(56) References Cited

U.S. PATENT DOCUMENTS

| | | | | |
|---|---|---|---|---|
| 6,522,282 B1 * | 2/2003 | Elbornsson | .................... | 341/155 |
| 7,084,793 B2 * | 8/2006 | Elbornsson | .................... | 341/118 |
| 7,283,074 B2 * | 10/2007 | Sheng et al. | .................. | 341/120 |
| 7,482,956 B2 * | 1/2009 | Huang et al. | .................. | 341/120 |
| 7,782,235 B1 * | 8/2010 | Velazquez | .................... | 341/118 |
| 7,916,051 B1 | 3/2011 | Sestok et al. | | |
| 7,961,123 B2 * | 6/2011 | Nagarajan et al. | ............. | 341/118 |
| 8,659,454 B2 * | 2/2014 | Sugimoto et al. | ............. | 341/118 |
| 8,836,550 B2 * | 9/2014 | Snelgrove | ..................... | 341/118 |
| 8,928,507 B2 * | 1/2015 | Taluja et al. | .................. | 341/118 |

OTHER PUBLICATIONS

Behzad Razavi, "Problem of Timing Mismatch in Interleaved ADCs", Publisher IEEE, Sep. 2012, pp. 1-8.

* cited by examiner

*Primary Examiner* — Khai M Nguyen
(74) *Attorney, Agent, or Firm* — Alan A. R. Cooper; Frank D. Cimino

(57) ABSTRACT

A system can include a signal image correlator receives a discrete frequency domain representation of a signal tone in an interleaved analog-to-digital (IADC) signal and an image of the signal tone in the discrete frequency domain representation of the IADC signal and determines a correlation between the signal tone and the image of the signal tone, a power of the signal tone and a power of the image of the signal tone. The system can also include a frequency domain estimator that determines an instantaneous frequency domain mismatch profile estimate based on the correlation between the signal tone and the image of the signal tone. The system can further include an averaging filter that averages the instantaneous frequency domain mismatch profile estimate over time to provide a frequency domain mismatch profile estimate.

20 Claims, 6 Drawing Sheets

MISMATCH PROFILE

CROSS REFERENCE TO RELATED APPLICATIONS

This application claims priority to Indian (IN) Patent Application entitled: "NOVEL, BLIND NON-PARAMETERIZED FREQUENCY DOMAIN ESTIMATOR FOR ESTIMATING MISMATCHES IN AN INTERLEAVED ADC", Application No.:1336/CHE/2014, filed on 13 Mar. 2014, which is incorporated herein by reference. Additionally, this application is related to the following commonly assigned co-pending patent applications entitled: "MISMATCH CORRECTOR", Ser. No. 14/656,122, filed Mar. 12, 2015 and "CLOSE-IN TONES", Ser. No. 14/656,025, filed Mar. 12, 2015, all of which are filed contemporaneously herewith and are incorporated herein by reference.

TECHNICAL FIELD

This disclosure relates to systems and methods for determining a mismatch profile.

BACKGROUND

An analog-to-digital converter (ADC, A/D converter, or A to D) is a device that converts a continuous physical quantity (e.g., voltage) into a digital value that represents the quantity's amplitude. The analog-to-digital conversion involves quantization of the input, such that a small amount of error is introduced. Moreover, instead of doing a single conversion, an ADC often performs the conversions ("samples" the input) periodically. The result is a sequence of digital values that have been converted from a continuous-time and continuous-amplitude analog signal to a discrete-time and discrete-amplitude digital signal.

A time-interleaved ADC uses N parallel ADCs where each ADC samples data every Nth cycle of the effective sample clock, where N is a positive integer. The result is that the sample rate is increased N times compared to what each individual ADC can manage.

SUMMARY

This disclosure relates to systems and methods for determining a mismatch profile. More particularly, the systems and methods can determine a mismatch profile of an interleaved analog-to-digital converter.

One example relates to a system that can include a signal image correlator that receives a discrete frequency domain representation of a signal tone in an interleaved analog-to-digital (IADC) signal and an image of the signal tone in the discrete frequency domain representation of the IADC signal and determines a correlation between the signal tone and the image of the signal tone, a power of the signal tone and a power of the image of the signal tone. The system can also include a frequency domain estimator that determines an instantaneous frequency domain mismatch profile estimate based on the correlation between the signal tone and the image of the signal tone. The system can further include an averaging filter that averages the instantaneous frequency domain mismatch profile estimate over time to provide a frequency domain mismatch profile estimate. The system can yet further include a time domain converter that converts the frequency domain mismatch profile estimate into the time domain.

Another example relates to an integrated circuit (IC) chip that can include an interleaved analog-to-digital converter (ADC) comprising a plurality of ADCs that are each configured to sample an analog signal in response to a clock pulse. The interleaved ADC can output an IADC signal that comprises a plurality of spurious signals formed from mismatches between the plurality of ADCs. The IC chip can also include a frequency domain processor to apply a Fast Fourier Transform (FFT) on the IADC signal to generate a discrete frequency domain representation of the IADC signal. The IC chip can further include a mismatch profile estimator that determines a frequency domain mismatch profile estimate for the IADC signal based on the discrete frequency domain representation of the IADC signal. The IC chip can yet further include a time domain converter that converts the frequency domain mismatch profile estimate into the time domain.

Yet another example relates to a method that can include applying a windowing function to selected blocks of samples of an interleaved analog-to-digital (IADC) signal. The method can also include applying a FFT to the windowed selected blocks of samples to determine a discrete frequency domain representation of the IADC signal. The method can further include correlating a conjugate of a tone in the discrete frequency domain representation of the IADC signal to determine a correlation between the tone and an image of the tone. The method can yet further include estimating an instantaneous frequency domain mismatch profile based on the correlation between the tone and the image of the tone. The method can still yet further include averaging a plurality of instances of the instantaneous frequency domain mismatch profile over time to determine a frequency domain mismatch profile estimate.

DETAILED DESCRIPTION

Systems and method are described for determining a blind (e.g., no training signal), non-parameterized, interleaving mismatch profile estimate for an output of an interleaved analog-to-digital converter (ADC). The systems and methods described herein do not require an estimation of individual gain and/or timing mismatches. Rather, the mismatches of the interleaved ADC can be modeled as a plurality of filters, and the mismatch profile can correspond to estimates for the plurality of filters in the ADC model.

In general, for an interleaved ADC with M number of ADCs (where M is an integer greater than one), there are M−1 spurs for every input tone. As used herein, the term "spur" corresponds to a spurious tone that interferes with the output of the interleaved ADC. Throughout this disclosure, these spurs are referred to as "images" of tones, since the images of the tones are correlated to the tones in the manner described herein. For purposes of simplification of explanation, throughout this disclosure an example is employed where there are 4 ADCs. In this situation, for an input tone at a frequency of $f_0$ and an amplitude of $A_0$, an output of the interleaved ADC can have three images occur due to the mismatches. In such a situation, the images of the tone can occur at $f_0+f_s/4$ ($f_s$ is the sampling frequency of the interleaved ADC), $f_0+2f_s/4$ and $f_0+3f_s/4$, with respective complex amplitudes of $G_1(f_0)A_0$, $G_2(f_0)A_0$ and $G_3(f_0)A_0$. Based on this information, the systems and methods described herein can estimate the three components $G_1(f)$, $G_2(f)$ and $G_3(f)$ for frequencies across a band. The three components can be converted into filter coefficients that can be employed in correction filters to remove the mismatches in the output of the interleaved ADC. Accordingly, the systems and methods described herein can reduce/eliminate mismatches from an interleaved ADC signal.

Figure 1:
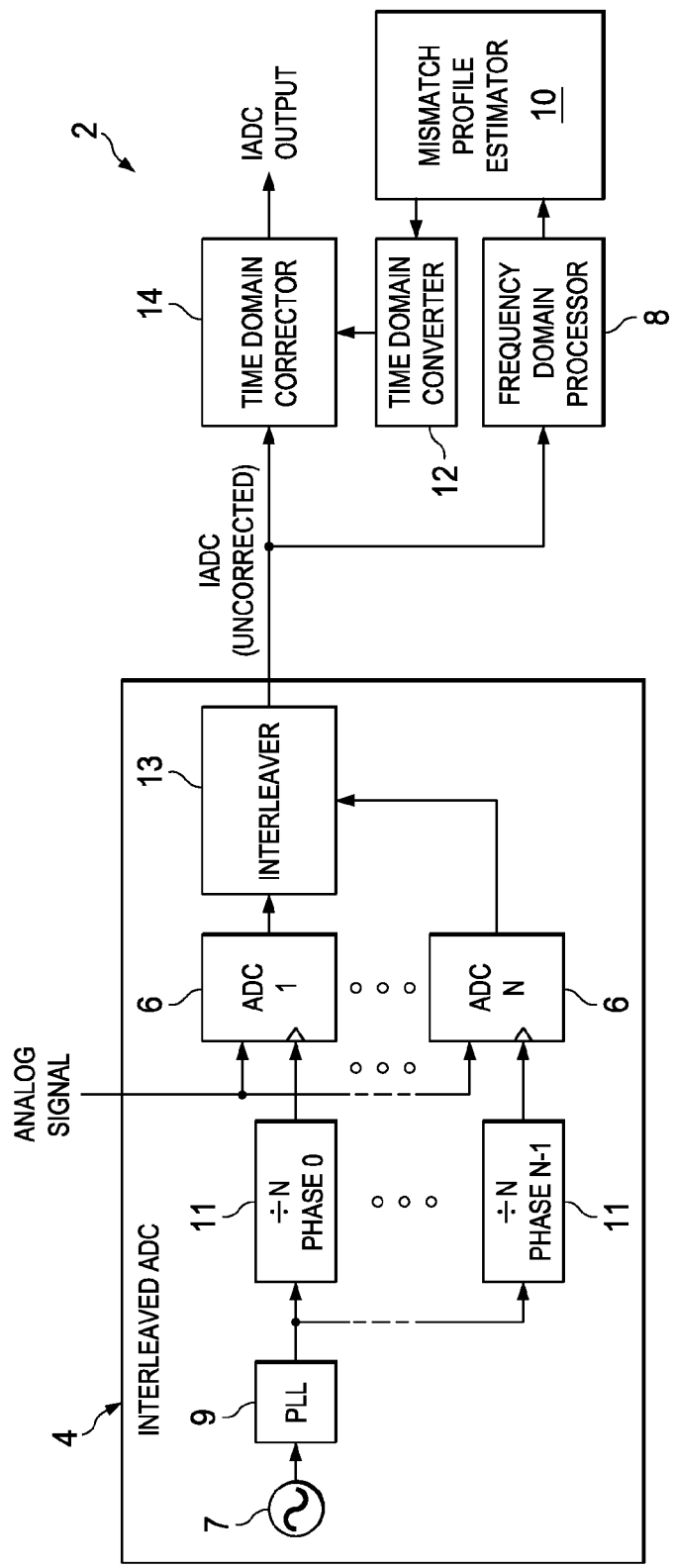
FIG. 1 illustrates an example of a system for determining a mismatch profile of an interleaved analog-to-digital converter (ADC).

FIG. 1 illustrates a block diagram of a system 2 for estimating mismatches in an interleaved ADC 4. The system 2 can be implemented, for example, as a circuit, such as an integrated circuit chip. For instance, the system 2 could be implemented as an Application Specific Integrated Circuit (ASIC) chip. In some examples, portions of the system 2 can be implemented as firmware accessible by a microcontroller. Additionally or alternatively, some of the blocks illustrated can be implemented as logic on a field programmable gate array (FPGA) or a combination of logic and firmware. Moreover, although each block of the system 2 is shown and described as performing specific functions, it is to be understood that in other examples, the operations of each block can be performed by other blocks and/or in cooperation with multiple blocks.

The interleaved ADC 4 can include an array of N number of ADCs 6 that can sample an analog signal (labeled in FIG. 1 as "ANALOG SIGNAL"). The interleaved ADC 4 can be a time-interleaved interleaved ADC. A sample clock causes each of the N number of ADCs 6 to sample the analog signal. Thus, at each Nth sample, a given ADC 6 samples the analog signal. Output from each of the N number of ADCs 6 is interleaved (e.g., multiplexed) and output as an interleaved ADC ("IADC") signal.

More particularly, in the system 2 a clock signal 7 can be provided to a phase locked loop (PLL) 9 that can be provided to N number of frequency dividers 11. The frequency dividers 11 can each control the sampling of a corresponding ADC 6. In some examples, the PLL 9 can output a clock signal and each frequency divider 11 can divide the output of the PLL 9 by N. For instance, in situations where the output of the PLL 9 has a frequency of 1 GHz, and there are 4 ADCs 6, each of the frequency dividers 11 could have an output with a frequency of 250 MHz at different phases. It is to be understood that in some examples, the clock signal 7 can be generated internally at the interleaved ADC 4 or external to the interleaved ADC 4 and/or the system 2. The output of each ADC 6 can be provided to an interleaver 13 that can multiplex (e.g., combine) the outputs of the ADCs 4 to form an IADC signal.

Due to inherent fabrication and design tolerances, each individual ADC 6 has a unique gain, sampling time offset and bandwidth and other unique characteristics. Thus, a given ADC 6 has at least a gain, sampling time offset and bandwidth mismatches relative to a reference ADC 6. The IADC signal includes N−1 spurs (images of tones) that are a result of the mismatches between the individual ADCs 6. Each set of mismatches relative to the reference ADC 6 can be referred to as a mismatch profile. The system 2 can correct these mismatches. Accordingly, the IADC output by the interleaver 13 of the interleaved ADC 4 is referred to as an uncorrected IADC signal labeled in FIG. 1 as "IADC (UNCORRECTED)".

The uncorrected IADC signal can be provided to a frequency domain processor 8. The frequency domain processor 8 can select and store blocks of the uncorrected IADC signal. The selection can be periodic, random or pseudo-random. The frequency domain processor 8 can be configured to apply a windowing function and a Fast Fourier Transform (FFT) function on the selected blocks of the uncorrected IADC signal. The windowing function can be implemented, for example, as the Blackman-Harris windowing function. The frequency domain processor 8 can provide frequency domain data that characterizes the FFT of the selected blocks of the uncorrected IADC signal to a mismatch profile estimator 10. The FFT of the selected blocks can be referred to as FFT blocks that characterize the spectral content of the uncorrected IADC signal as a function of contiguous frequency bands referred to as FFT bins.

The mismatch profile estimator 10 can apply a validity check to the FFT bins. In particular, the validity check can perform a first validity check that compares a power of a given FFT bin to a first threshold, and rejects FFT bins that have a power below the first threshold. In this manner, the first validity check can reject low power signals and/or mismatches themselves from being processed as valid inputs for estimating the mismatch profile, thereby avoiding possible interferer generated bias. Additionally, the mismatch profile estimator 10 can perform a second validity check that compares a ratio of a power of a signal bin (an FFT bin containing a given signal/tone) and a power of an image bin (an FFT bin containing an image of the given signal/tone), which ratio can be referred to as a signal-to-image power ratio (signal-to-image power ratio) to a second threshold. If the signal-to-image power ratio is below the second threshold, a corresponding signal-image bin can be rejected. For instance, in one example, if the second validity check fails for a particular signal, $A_0$ and a corresponding image, $G_1A_0$, no correlation is calculated between $A_0$ and $G_1A_0$. However, in such a situation, the second validity check would be performed separately on the signal-to-image power ratio between $A_0$ and $G_2A_0$ and between $A_0$ and $G_3A_0$, since there may be a (relatively large) interferer near $G_1A_0$, but not near $G_2A_0$ and/or $G_3A_0$. The mismatch profile estimator 10 can determine and accumulate a correlation, signal and image power, and noise variance estimate across the non-rejected FFT bins characterized in the frequency domain data.

The mismatch profile estimator 10 can calculate an instantaneous frequency domain mismatch profile estimate for each selected input frequency. The mismatch profile estimator 10 can also calculate an uncertainty of each instantaneous frequency domain mismatch profile estimate based on the aggregated statistics. Data characterizing the instantaneous frequency domain estimate and the corresponding uncertainty can be employed by the mismatch profile estimator 10 to interpolate the frequency domain mismatch profile estimate for each of interleaved ADC 4 over a range of frequencies, including band edges. In particular, the mismatch profile estimator 10 can provide a frequency domain mismatch profile for each of the ADCs 6 in the interleaved ADC 4.

The mismatch profile estimator 10 can provide the frequency domain profiles of each of the ADCs 6 to a time domain converter 12. The time domain converter 12 can employ an Inverse Fast Fourier Transform (IFFT) to convert the mismatch profile of each of the ADCs 6 into filter coefficients in the time domain. The filter coefficients can be provided to a time domain corrector 14. The time domain corrector 14 can employ the filter coefficients in correction filters to subtract the mismatch profile for each of the ADCs 6 from the uncorrected IADC signal to produce a corrected IADC output.

Figure 2:
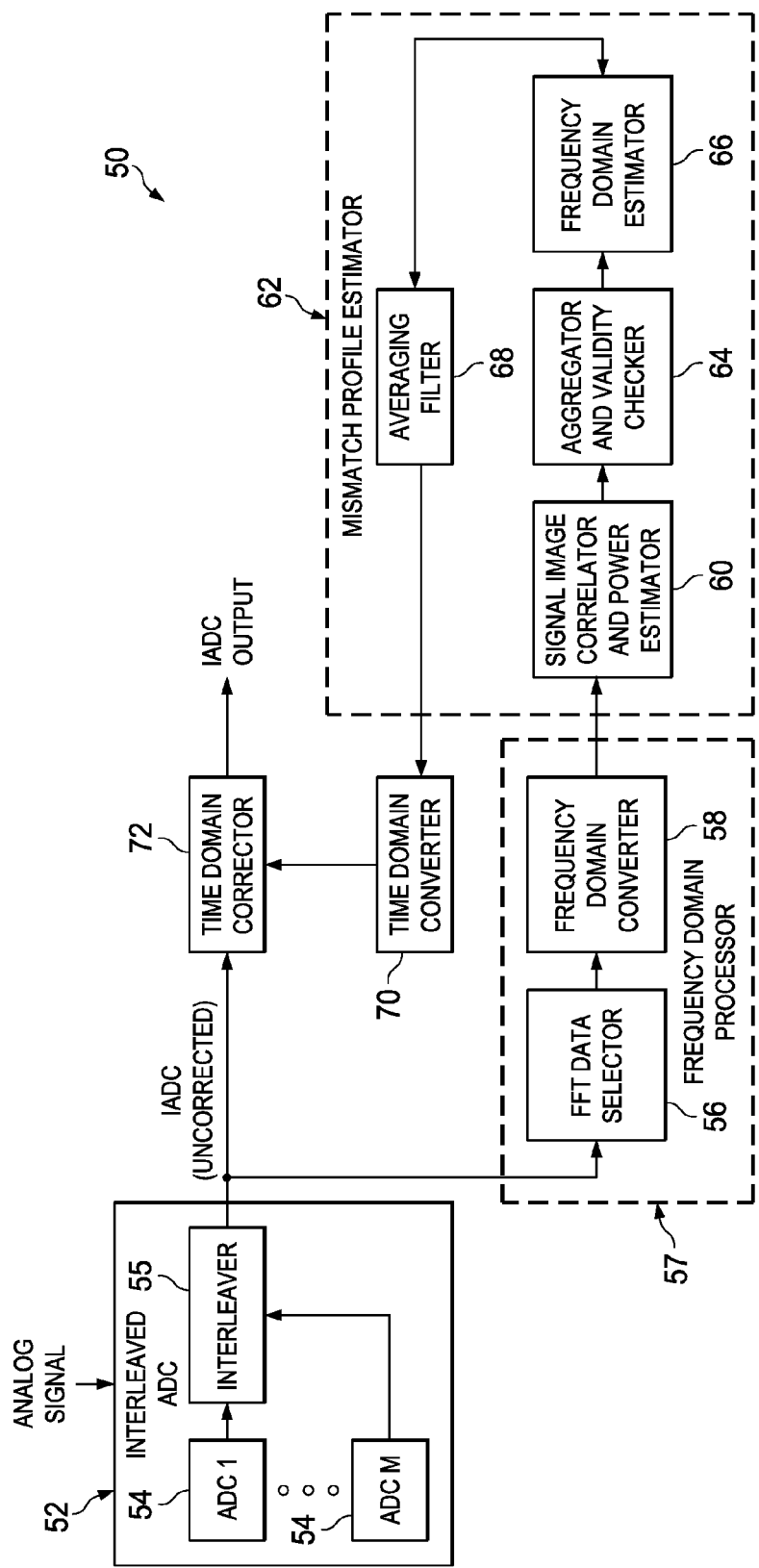
FIG. 2 illustrates another example of a system for determining a mismatch profile of an interleaved ADC.

FIG. 2 illustrates another block diagram of a system 50 for estimating mismatches in an interleaved ADC 52. The system 50 can be employed for example, to implement the system 2 illustrated in FIG. 1. The interleaved ADC 52 can include M number of parallel ADCs 54 that each sample an analog signal (labeled in FIG. 2 as "ANALOG SIGNAL"), where M is an integer greater than one. For purposes of simplification of explanation, in a simplified given example, (hereinafter, "the given example") it is presumed that there are 4 ADCs 54 in an interleaved ADC 52, but in other examples more or less ADCs 54 can be employed. The output from each of the 4 ADCs 54 can be combined (e.g., multiplexed) by an interleaver 55 and output as an uncorrected IADC signal (labeled in FIG. 2 as IADC (UNCORRECTED).

Figure 3:
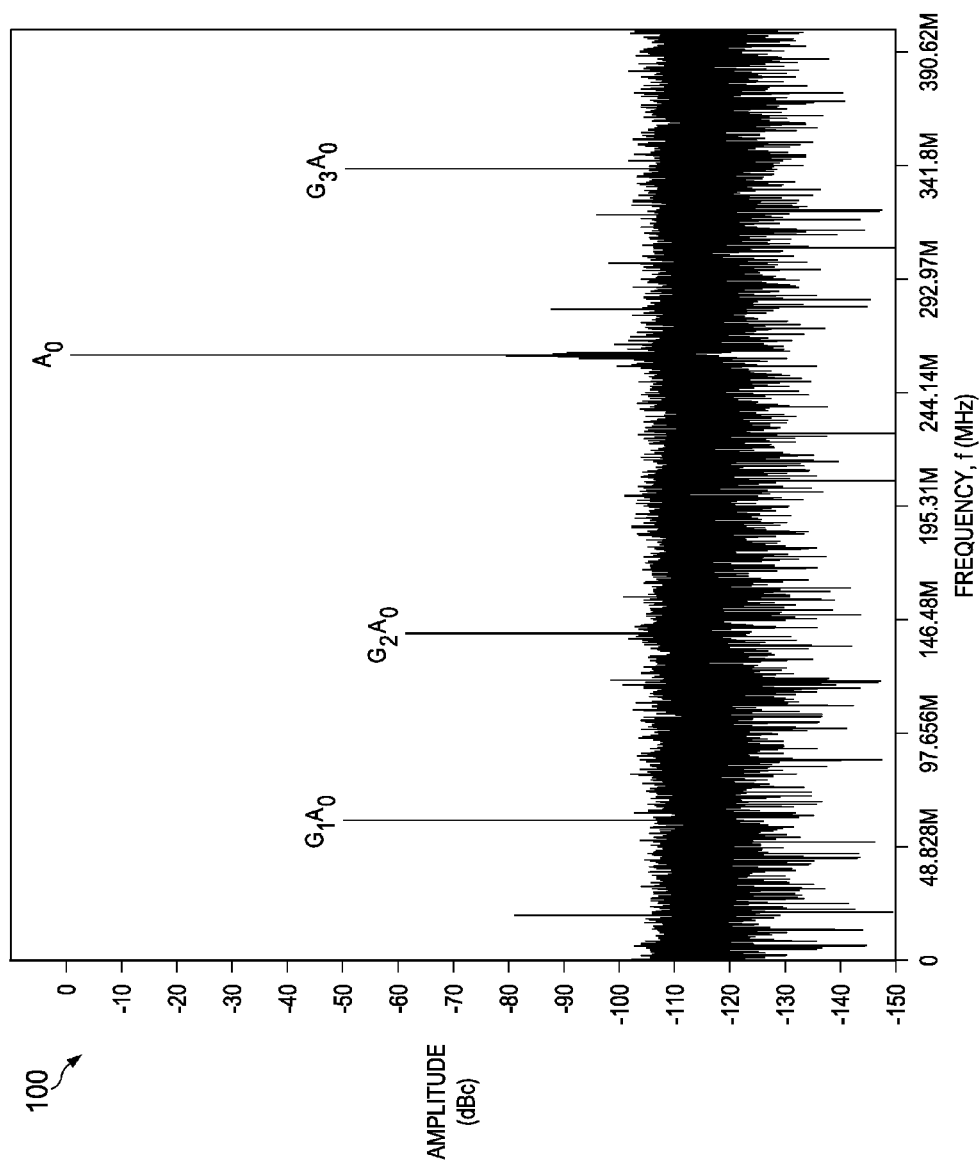
FIG. 3 illustrates an example of a graph depicting an output of an interleaved ADC without mismatch correction.

Due to inherent design tolerances of the ADCs 54, each individual ADC 54 has a unique gain, sampling time offset and bandwidth that causes a mismatch between each individual ADC 54 and a reference (e.g., a first) ADC 54. $G_k(f)$ can represent a frequency domain mismatch profile of the interleaved ADC 52. In the given example, in the equivalent discrete time model 150, a given input tone at a frequency of $f_0$ and an amplitude of $A_0$, with a sampling frequency of $f_s$ is input for $x(n)$. It is noted that although examples are employed that describe individual (constant) tones, the system 50 can also process wideband signals wherein tones change amplitude, phase and frequency over time. As is illustrated, due to the mismatches the given input tone causes an extra tone with complex amplitude of $G_k(f_0)A_o$ at a frequency of $f_0+k*f_s/M$. Moreover, in the given example with 4 interleaved ADCs, an input tone will generate 3 other tones (e.g., images/spurs). FIG. 3 illustrates an example a graph 100 of an uncorrected IADC output represented in the given example. In the graph 100, amplitude of a signal, in decibels relative to a carrier signal (dBc) are plotted as a function of a frequency, f, in Megahertz (MHz). As illustrated in the graph 300, in the given example, there are 3 images of a tone at the frequencies, $f_0+f_s/4$, $f_0+2f_s/4$ and $f_0+3*f_s/4$ with respective complex amplitudes $G_1(f_0)*A_0$, $G_2(f_0)*A_0$ and $G_3(f_0)*A_0$ for the input tone of amplitude $A_0$. In some examples, these frequencies can alias back into $-fs/2$ $fs/2$. Equation 1 characterizes the uncorrected IADC output in the frequency domain, $Y(f)$.

$$Y(f) = X(f)e^{-j2\pi f\Delta} + \sum_{k1=0}^{3} X\left(f - \frac{k1f_s}{4}\right)G_{k1}\left(f - \frac{k1f_s}{4}\right) \quad \text{Equation 1}$$

Referring back to FIG. 2, the uncorrected IADC signal can be provided to a FFT data selector 56 of a frequency domain processor 57. The frequency domain processor 57 can be employed to implement the frequency domain processor 8 of FIG. 1. The FFT data selector 56 can select and store blocks of the uncorrected IADC signal. The selection can be periodic, random or pseudo-random. The selected blocks of the uncorrected IADC signal can be provided to a frequency domain converter 58 of the frequency domain processor 57.

The frequency domain converter 58 can apply an initial validity check on the selected blocks of the uncorrected IADC signal and remove blocks that violate certain conditions. For instance, the frequency domain converter 58 can examine the selected blocks to determine if more than a specified number of samples are greater than a saturation threshold in absolute value. If the determination for a block is true, then that block can be rejected. This determination can be employed as a saturation based FFT block rejection. Accordingly, if a selected sample in a block is higher than a value close to saturation, then that block can be deemed to be nearly saturated and dropped, thereby avoiding problems that arise due to saturation of a signal. Additionally, the frequency domain converter 58 can examine each of the selected blocks to determine if the overall block power is less than a power threshold for a given block. Each of the selected blocks with an overall power below the power threshold can be rejected to avoid cases where there is no real input and only ADC noise is detected as output. Such a rejection of the selected blocks can improve estimation of the mismatch profile.

The frequency domain converter 58 can be configured to apply a windowing function and an FFT function to the non-rejected selected blocks of the uncorrected IADC signal. The windowing size can be selected to ensure that window leakage is sufficiently removed from the signal (e.g., a tone), such that the leakage is sufficiently less than the permitted error (e.g., about −100 dBc when the permitted error is −80 dBc) in an estimate of the frequency domain profile, $G_k(f)$. In one example, the windowing function can be implemented, for example, as the Blackman-Harris windowing function with a window length of about 512 samples. In other examples, different window sizes can be employed. The frequency domain converter 58 can provide frequency domain data that characterizes the FFT of the selected blocks of the uncorrected IADC signal to a signal image correlator and power estimator 60 of a mismatch profile estimator 62. The FFT of the selected blocks can be referred to as FFT blocks that characterize the spectral content of the uncorrected IADC signal as a function of contiguous frequency bands referred to as FFT bins.

The mismatch profile estimator 62 can be employed to implement the mismatch profile estimator 10 of FIG. 1. The signal image correlator and power estimator 60 can determine a correlation between tones for each of the FFT bins. The correlation between two tones, $C_k(f)$ can be characterized by Equation 2.

$$C_k(f) = Y\left(f + \frac{kf_s}{4}\right)Y^*(f) \quad \text{Equation 2}$$

wherein:

$Y^*(f)$ is the conjugate of $Y(f)$.

Further, by substituting Equation 1 into Equation 2, Equation 3 can be derived.

$$C_k(f) = G_k(f)e^{j2\pi f\Delta}|X(f)|^2 + G_{4-k}^*\left(f + \frac{kf_s}{4}\right)e^{-j2\pi\left(f+\frac{kf_s}{4}\right)\Delta}\left|X\left(f + \frac{kf_s}{4}\right)\right|^2 + n'(f) \quad \text{Equation 3}$$

wherein:

$$n'(f) = X\left(f + \frac{kf_s}{4}\right)X^*(f) + \text{small second order terms}$$

Equation 3 can be simplified by incorporating (e.g., absorbing) the delay term, $e^{j2\pi f\Delta}$ into $G_k(f)$ during estimation and the delay term, $e^{j2\pi f\Delta}$ can be removed prior to conversion to the time domain. Additionally, in Equation 3, $C_k(f)$ is a measurable parameter, and $X(f)$ is unknown. Moreover, the term $X(f)$ can be approximated with the term $Y(f)$, which is also measureable. Thus, Equation 3 can be simplified and rewritten as Equation 4.

$$C_k(f) = G_k(f)|Y(f)|^2 + G^*_{4-k}\left(f + \frac{kf_s}{4}\right)\left|Y\left(f + \frac{kf_s}{4}\right)\right|^2 + n''(f) \quad \text{Equation 4}$$

wherein:

n''(f) captures the effect of n'(f) and other second order terms due to approximating $X(f)$ with $Y(f)$.

In the given example, by employing Equation 3, the signal image correlator and power estimator 60 can correlate the conjugate of the given (single) input tone ($A_0$) (such that $X(f_0)=A_0$ and $X(f)=0$, elsewhere) with the appropriate image ($G_k A_0$) to derive Equation 5.

$$C_k(f_0) = G_k(f_0)|A_0|^2 \quad \text{Equation 5}$$

The signal image correlator and power estimator 60 can measure $C_k(f_0)$ from the FFT bins. Additionally, the signal image correlator and power estimator 60 can estimate a power, in decibels to full scale (dBFS) for each tone in the FFT bins. Data characterizing the correlation and power estimate for each of the tones in the FFT bins can be provided to an aggregator and validity checker 64 of the mismatch profile estimator 62.

The aggregator and validity checker 64 can be configured to apply a first validity check that compares the determined power of each tone to a threshold (e.g., of about −40 dBFS). Tones with a power of less than the threshold fail the first validity check and can be rejected from aggregation. Additionally, the aggregator and validity checker 64 can apply a second validity check to determine if a signal-to-image power ratio, is greater than a threshold (e.g., second threshold) to limit estimation errors due to interferer generated bias. "Equation 6" defines an inequality that indicates whether the signal power $P^i(m)$ is large enough, relative to a power of the image, $$P^i\left(\left[m + k\frac{N}{4}\right]_N\right)$$

to be aggregated.

$$P^i(m) > \gamma P^i\left(\left[m + k\frac{N}{4}\right]_N\right) \quad \text{Equation 6}$$

wherein:

throughout this disclosure, the operator $$\text{"}\left[m + k\frac{N}{4}\right]_N\text{"}$$

represents $$m + k\frac{N}{4}$$

modulo N; and

γ is the threshold (e.g., about −10dBc)

Signals with a signal-to-image power ratio that do not return a "true" for the inequality of Equation 6 fail the second validity check and can be rejected from aggregation. For instance, the aggregator and validity checker 64 can employ Equation 6 to determine the signal-to-image power ratio based on a power of a bin at a location of a given tone relative to a power of a bin location of an image of the given tone. Equation 7 represents a simplified equation for calculating the power of a signal, $P^i(m)$ in one example.

$$P^i(1) \approx |A_m|^2 \quad \text{Equation 7}$$

Figure 4:
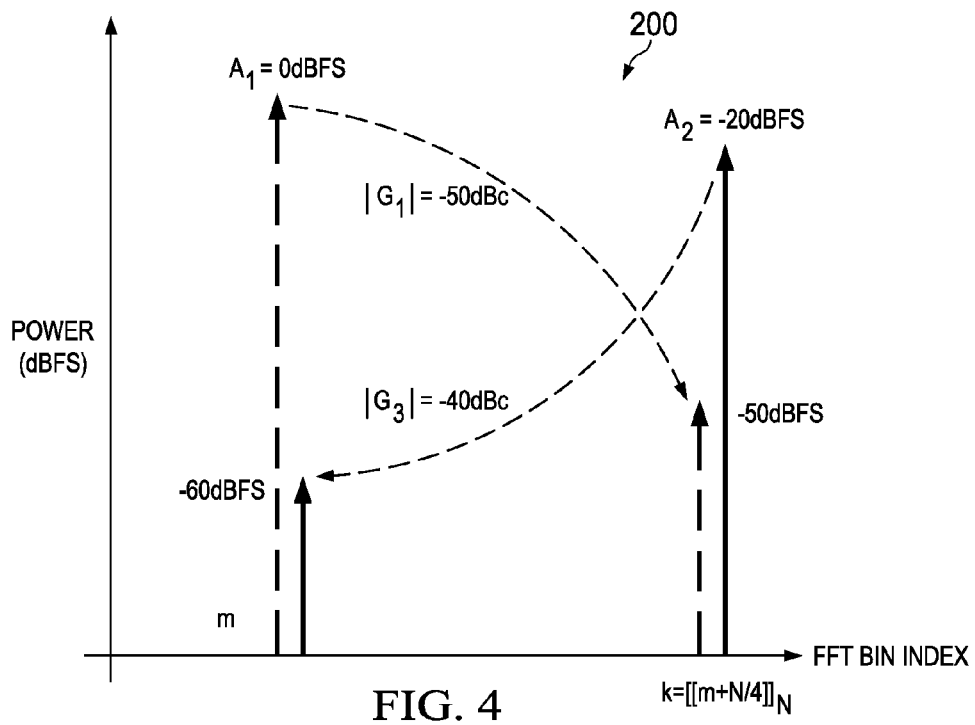
FIG. 4 illustrates an example of a diagram that depicts the power, in dBFS of tones and images of tones as a function of Fast Fourier Transform (FFT) bin index.

FIG. 4 illustrates an example of a diagram 200 that depicts the power, in dBFS of tones and images of tones as a function of an FFT bin number (e.g., an FFT bin index) characterized in Equation 7. As illustrated in Equation 7, the magnitude of $G_3$ is about −50 dBC relative to $A_2$ and the magnitude of $G_1$ is −50 dBc relative to $A_1$. Referring back to FIG. 2, if it is determined that the signal power/image power ratio, $P^i(m)$ returns a "false" for the inequality of Equation 6, the aggregator and validity checker 64 rejects the tone from aggregation.

The non-rejected tones, namely tones that passed the first and second validity checks are aggregated, as well as correlations, signal and image power and noise variance estimates are accumulated across the selected FFT bins. The aggregator and validity checker 64 can employ Equation 8 to determine the correlation for the mth bin with the kth image. Moreover, Equation 9 represents Equation 8 rewritten as a relation between the measurement of a correlation $C_k^i(m)$ for the ith FFT bin as a function of a power of tones $P^i(m)$, a power of an image of tone, $$P^i\left(\left[m + k\frac{N}{4}\right]_N\right)$$

and an unknown mismatch profiles $G_k(m)$ and $$G^*_{4-k}\left(\left[m + k\frac{N}{4}\right]_N\right).$$

$$C_k(m) = Y\left(m + \frac{N}{4}\right) \cdot Y^*(m) \quad \text{Equation 8}$$

$$C_k^i(m) = \quad \text{Equation 9}$$
$$G_k(m)P^i(m) + G^*_{4-k}\left(\left[m + k\frac{N}{4}\right]_N\right)P^i\left(\left[m + k\frac{N}{4}\right]_N\right) + n'^i(m)$$

The aggregator and validity checker 64 can aggregate correlation values (when the values pass the first and second validity checks) for a predetermined (e.g., preprogrammed) number of the FFT bins by employing Equation 10.

$$\sum_i C_k^i(m)V_k^i(m) = G_k(m)\sum_i V_k^i(m)P^i(m) + \quad \text{Equation 10}$$

$$G_{4-k}^*\left(\left[\!\left[m+k\frac{N}{4}\right]\!\right]_N\right)\sum_i V_k^i(m)P^i\left(\left[\!\left[m+k\frac{N}{4}\right]\!\right]_N\right) +$$

$$\sum_i V_k^i(m)n'^i(m)$$

wherein:

$V_k^i(m)=1$ for all correlation values that are valid (pass the first and second validity checks); and $V_k^i(m)=0$ for all correlation values that are invalid (fail the first or second validity check).

The sum of correlation and the sum of signal and image power for the selected FFT bins can be stored by the aggregator and validity checker 64 as aggregated statistics, for example in a non-transitory machine readable medium (e.g., a memory). In some examples, the aggregated statistics can be stored as a data structure (e.g., a linked list). Moreover, Equation 9 can be employed to estimate unknown mismatch profiles, $G_k$ (m) for the non-rejected (valid) tones. The aggregator and validity checker 64 can determine an aggregate power of both contributors (a tone, and images of the tone) by employing Equation 11 and Equation 12.

$$\Sigma_i V_k^i(m) P^i(m) \quad \text{Equation 11}$$

$$\sum_i V_k^i(m)P^i\left(\left[\!\left[m+k\frac{N}{4}\right]\!\right]_N\right) \quad \text{Equation 12}$$

The aggregate power of both contributors can be stored by the aggregator and validity checker 64 in the aggregate statistics. Furthermore, the aggregator and validity checker 64 can determine an aggregate noise present in the FFT bins by employing Equation 13.

$$\sum_i V_k^i(m)n'^i(m) \sim N\left(\sum_i V_k^i(m)P^i\left(\left[\!\left[m+k\frac{N}{4}\right]\!\right]_N\right)\right) \quad \text{Equation 13}$$

The aggregator and validity checker 64 can determine a noise variance, $R^k(m)$ based on the aggregated noise characterized in Equation 13. The noise variance, $R^k(m)$ can also be stored in the aggregated statistics by the aggregator and validity checker 64. The aggregated statistics can be provided to (and/or retrieved by) a frequency domain estimator 66 of the mismatch profile estimator 62.

Furthermore, the aggregator and validity checker 64 can parse the aggregated statistics to detect correlated tones. If two tones are present at exactly (or almost exactly) at signal-image frequency pairs, the two tones can cause a misestimate of $G_k(m)$. Thus, the aggregator and validity checker 64 can be configured to detect and reject (e.g., remove) such correlated signal-image frequency pairs from the aggregated statistics if the correlation between signal-image tones is greater than a maximum likely interleaving mismatch from the uncorrected IADC signal. In a situation where two correlated tones do exist, noise terms on the correlation add up coherently during aggregation, thereby resulting in a larger noise that what is initially postulated by the aggregator and validity checker 64. The aggregator and validity checker 64 can employ Equation 14 to determine a correlation measurement for an mth bin with its kth image.

$$C_k(m) = G_k(m)P(m) + G_{4-k}^*\left(\left[\!\left[m+k\frac{N}{4}\right]\!\right]_N\right)P\left(\left[\!\left[m+k\frac{N}{4}\right]\!\right]_N\right) + n; \quad \text{Equation 14}$$

wherein:

$n \sim N(0, R^k(m))$.

It is noted in Equation 14, that for purposes of simplification of explanation, $\Sigma_i C_k^i(m) V_k^i(m)$ has been replaced with $C_k(m)$, while $\Sigma_i V_k^i(m)P^i(m)$ has been replaced with P(m) and $\Sigma_i$ $$V_k^i(m)P^i\left(\left[\!\left[m+k\frac{N}{4}\right]\!\right]_N\right)$$

has been replaced with $$P\left(\left[\!\left[m+k\frac{N}{4}\right]\!\right]_N\right).$$

Accordingly, correlation and power measurements represented herein can refer to their aggregated values (over the appropriate selected blocks).

From Equation 14, an inequality, labeled as "Equation 15" can be derived.

$$|C_k(m)| - |G_{max}|\left[P(m) + P\left(\left[\!\left[m+k\frac{N}{4}\right]\!\right]_N\right)\right] < |n| \quad \text{Equation 15}$$

wherein:

$|G_{max}|$ is the absolute value of a worst expected mismatch and is presumed to be −40 dBc; and n is the detected noise.

In situations where the noise term, n is a result of averaging of noise components for FFT bins across multiple FFT blocks (e.g., the same bin across multiple blocks), then it is expected that $|n| < 4\sqrt{R^k(m)}$, and if this is not true, the measurement $C_k(m)$ is suspected to be invalid. Accordingly, a measurement can be rejected and removed from the aggregated statistics if the inequality of "Equation 16" returns a value of true. Stated differently, Equation 16 denotes that if a determined correlation $C_k(m)$ indicates that the mismatch is very large, then the correlation $C_k$ (TO is not a real correlation, and therefore, rejected. In other examples, the relationship identified in Equation 16 can implemented through other realizations, such as situations where $R_k(m)=0$, etc.

$$|C_k(m)| - |G_{max}|\left[P(m) + P\left(\left[\!\left[m+k\frac{N}{4}\right]\!\right]_N\right)\right] > 4\sqrt{R^k(m)} \quad \text{Equation 16}$$

The frequency domain estimator 66 can employ the correlation values stored in the aggregate statistics to calculate (e.g., estimate) an instantaneous frequency domain mismatch profile estimate, $G_k(f_0)$ for all FFT bins that have valid mismatch profile estimates. In the given example, explained with respect to Equation 10, since $C_k(f_0)$ and $|A_0|^2$ are known (via the aggregated statistics), $G_k(f_0)$ (including $G_1(f_0)$, $G_2(f_0)$ and $G_3(f_0)$) and can be determined/estimated.

For instance, in a two-tone-varying power example (hereinafter, "two-tone example"), an input signal can have a power in bin m and the input signal has an image bin [[m+

$kN/4]]_N$, presuming (i) that the input tones are not exactly separated by a frequency of $kf_s/4$ and (ii) that the powers in these bins, P(m) and $$P\left(\left[\!\left[m+k\frac{N}{4}\right]\!\right]_N\right),$$

respectively, vary significantly over time such that there are times which the power of each of the bins exceeds the power of the other bin by at least 10 dB.

In the two-tone example, the aggregation statistics can include $C_k(m)$ and $$C_{4-k}\left(\left[\!\left[m+k\frac{N}{4}\right]\!\right]_N\right).$$

In the two-tone example, these correlation values depend only on $$G_k(m) \text{ and } G_{4-k}\left(\left[\!\left[m+k\frac{N}{4}\right]\!\right]_N\right).$$

Accordingly, from the measurements $C_k(m)$ and $$C_{4-k}\left(\left[\!\left[m+k\frac{N}{4}\right]\!\right]_N\right),$$

the terms $G_k(m)$ and $$G_{4-k}\left(\left[\!\left[m+k\frac{N}{4}\right]\!\right]_N\right)$$

can be solved for. In some situations, such a derivation can be facilitated with an averaging filter 68, such as a two-state Kalman filter (described herein) to track the estimates of $G_k(m)$ and $$G_{4-k}\left(\left[\!\left[m+k\frac{N}{4}\right]\!\right]_N\right)$$

over time.

Alternatively, in some situations of the two-tone example, a prior estimate for only one of the terms $G_k(m)$ and $$G_{4-k}\left(\left[\!\left[m+k\frac{N}{4}\right]\!\right]_N\right)$$

may be available. In this situation, presuming that a prior estimate of $$G_{4-k}\left(\left[\!\left[m+k\frac{N}{4}\right]\!\right]_N\right)$$

is available (presumed to be $\hat{G}^*_{4-k}$), the estimate of $G_k(m)$, referred to as $\hat{G}_{k,I}(m)$, can be derived from Equation 17.

$$\hat{G}_{k,I}(m) = \frac{C_k(m) - \hat{G}^*_{4-k} P\left(\left[\!\left[m+k\frac{N}{4}\right]\!\right]_N\right)}{P(m)} \quad \text{Equation 17}$$

In a similar fashion, in situations where an estimate of $G_k$ (TO is available, an estimate for $$G_{4-k}\left(\left[\!\left[m+k\frac{N}{4}\right]\!\right]_N\right)$$

can be determined in a similar manner. The estimates for $G_k(m)$ and $$G_{4-k}\left(\left[\!\left[m+k\frac{N}{4}\right]\!\right]_N\right)$$

can be tracked over time by the averaging and filter 68. Specifically, over multiple iterations, the estimates of $G_k(m)$ and $$G_{4-k}\left(\left[\!\left[m+k\frac{N}{4}\right]\!\right]_N\right)$$

converge. In some situations, only one tone gets valid measurements, thereby resulting in only one equation with two unknowns, $G_k(m)$ and $$G_{4-k}\left(\left[\!\left[m+k\frac{N}{4}\right]\!\right]_N\right).$$

In such a situation, given that $C_k(m)$ is aggregated, and $$P^i(m) > \gamma P^i\left(\left[\!\left[m+k\frac{N}{4}\right]\!\right]_N\right)$$

from Equation 6 such that only a small error is caused by assuming that $$G_{4-k}\left(\left[\!\left[m+k\frac{N}{4}\right]\!\right]_N\right) = 0$$

in Equation 17 to solve for $G_k(m)$, and this assumption is correct in situations where the actual input is a single tone. In situations where there are actually multiple input tones (two signal tones that are at signal-image locations) and with a correlation estimate for only one tone is available, an error of $$G_{4-k}\left(\left[\!\left[m+k\frac{N}{4}\right]\!\right]_N\right) P^i\left(\left[\!\left[m+k\frac{N}{4}\right]\!\right]_N\right) / P^i(m)$$

results, and this error is small in most cases of interest. Also this assumption of $$G_{4-k}\left(\left[\!\left[m+k\frac{N}{4}\right]\!\right]_N\right)=0 \qquad 5$$

results in an improved estimation of the mismatch profile $G_k(m)$ from the uncorrected IADC signal compared to the case when no estimate is available. As noted, if estimates are available for both tones, both $G_k(m)$ and $$G_{4-k}\left(\left[\!\left[m+k\frac{N}{4}\right]\!\right]_N\right)$$

converge to the correct estimates over multiple iterations resulting in the improved estimates of the mismatch profile. Data characterizing the instantaneous frequency domain mismatch profile estimate, $G_k(f)$ can be provided to an averaging filter 68.

Additionally, the frequency domain estimator can determine an uncertainty (e.g. error variance) for each instantaneous frequency domain profile estimate, $G_k(f)$. In the two-tone example, given a prior uncertainty from the averaging filter for the term $$G_{4-k}\left(\left[\!\left[m+k\frac{N}{4}\right]\!\right]_N\right),$$

which can be represented as $\sigma_{4-k}^2$, the uncertainty for the term $G_k(m)$, which can be represented as $\sigma_{k,I}^2(m)$, can be calculated from Equation 18. Data characterizing the uncertainty estimates $\sigma_{k,I}^2(m)$ can also be provided to the averaging filter 68.

$$\sigma_{k,I}^2(m) = \frac{R_k(m)+P^2\left(\left[\!\left[m+k\frac{N}{4}\right]\!\right]_N\right)\sigma_{4-k}^2}{P^2(m)} \qquad \text{Equation 18}$$

Referring back to FIG. 2, the averaging filter 68 can include, for example, a Kalman filter, an infinite input response (IIR) filter or the like. The averaging filter 68 can store historical data charactering past instantaneous frequency domain mismatch profile estimates, $G_k(m)$ for different frequencies.

In situations where the averaging filter includes a Kalman filter, the Kalman filter can generate time varying weights for the estimations of $G_k(m)$. The Kalman filter can include two components, a process model that can determine time evolution of a state of $G_k(m)$ and process noise with a covariance matrix Q that indicates a rate of change of a state of $G_k(m)$. For instance, $G_k(m)$ can be modeled as an older value plus process noise. The Kalman filter can also include a measurement model that can relate measurements to the state of $G_k(m)$. In general, the measurement is presumed to be equal to $G_k(m)$ with a noise variance of R. It is noted that situations where there are multiple tones, multiple instances of $G_k(m)$ can be output by the Kalman filter. Equation 19-21 characterize features and calculations of the Kalman filter. As is shown in Equation 19-21, the averaging filter 68 (that can include the Kalman filter) can determine a frequency domain mismatch profile $G_k(m)$, recursively.

$$K = \frac{\sigma_{k,t}^2(m)+Q}{\sigma_{k,t}^2(m)+Q+R_k(m)} \qquad \text{Equation 19}$$

$$\hat{G}_{k,t+1}(m)=\hat{G}_{k,t}(m)+K[\hat{G}_{k,inst}(m)-k_t(m)] \qquad \text{Equation 20}$$

$$\sigma_{k,t+1}^2(m)=(1-K)\sigma_{k,t}^2(m) \qquad \text{Equation 21}$$

wherein:

K is the gain of the Kalman filter;

Q is the process noise variance matrix that determines the variance of the noise added to the state estimates in the Kalman filter;

$\hat{G}_{k,t+1}(m)$ is a new frequency domain mismatch profile estimate;

$\hat{G}_{k,t}(m)$ is a current frequency domain mismatch profile estimate;

$\hat{G}_{k,inst}(n)$ is an instantaneous frequency domain mismatch profile estimate;

$\sigma_{k,t+1}^2(m)$ is a new uncertainty for the new frequency domain mismatch profile estimate, $\hat{G}_{k,t+1}(m)$;

$\sigma_{k,t}^2(m)$ is an uncertainty for the current frequency domain mismatch profile, $\hat{G}_{k,t}(m)$;

$R_k(m)$ is the noise variance of the instantaneous frequency domain mismatch profile estimate; and t is the iteration number of the Kalman Filter that increases by 1 with every iteration.

In some examples, the Kalman filter can be seeded with initial conditions that are defined by $\hat{G}_{k,0}(m)=0$, $\sigma_{k,0}^2(m)=10^{-4}$, which corresponds to −40 dBc initial uncertainty, since the as the mismatch can at worst be −40 dBc, in one example. In other examples, the Kalman filter can be seeded with different initial conditions. The output of the averaging filter 68, $G_k(m)$ can be presumed valid for current estimates or past estimates.

As noted in Equation 19, the Kalman filter of the averaging filter 68 can have a process noise variance, Q. The value of Q can be selected based on expected variations of $G_k(m)$ over time. For instance in the given example, Q can be derived based on a parameter that a step change in $G_k(m)$ should be tracked within 250 milliseconds (ms) with an accuracy of at least about −80 dBc in the presence of an uncorrelated interferer in an image band of 50 dB below a signal of interest. In such a situation, the level of the interferer relative to the signal of interest specifies the correlation measurement noise variance of $R_k(m)$.

Figure 5:
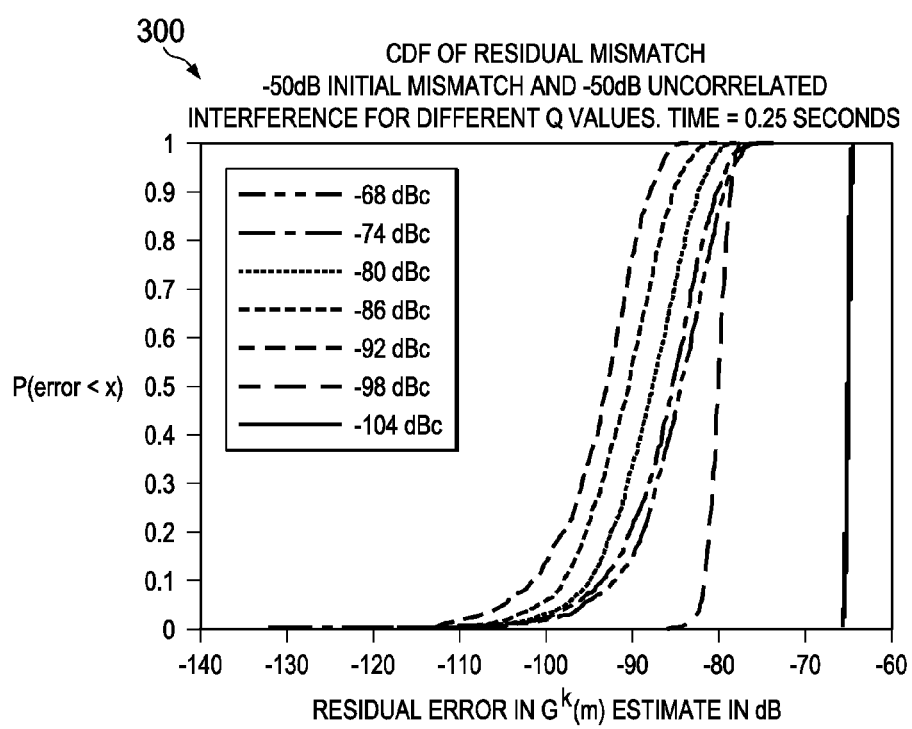
FIG. 5 illustrates an example of a graph to facilitate selection of Q factors of a Kalman filter.

FIG. 5 depicts a graph 300 that plots a probability that the error is less than a threshold amount, labeled in FIG. 5 as 'X' as a function of a residual error estimate for the frequency domain profile estimate, $G_k(m)$ in decibels (dB), wherein for a given value, V on the graph 300 (in dB) the Q factor=$10^{V/10}$. In the given example, it is presumed that an aggregation duration of 8 ms, which corresponds to about 31 Kalman Filter updates in 250 ms. As is illustrated, selecting a value, V, of −92 dBc provides an optimal Q factor of $10^{-9.2}$ for the given example. The Q factor of $10^{-9.2}$ indicates that the uncertainty of $G_k(m)$ is weakened by −92 dBc for every Kalman filter prediction. As a simplified example, such an indication corresponds to an expectation that $G_k(m)$ changes by 92 dBc every 8 ms. Other methods could also be used to determine the process noise variance, Q. For example, variation of a mismatch profile with temperature along with the knowledge of the rate of change of temperature with time can be employed to provide an estimate of rate of change of mismatch profile with time. The absolute value of this estimated rate of change can be employed as the process noise variance Q.

Referring back to FIG. 2, in some examples, the Kalman filter can reject an estimate for a particular bin of the frequency domain mismatch profile estimate, $\hat{G}_{k,t}(m)$ from being included in further processing if that particular bin of the frequency domain mismatch profile estimate $\hat{G}_{k,t}(m)$ has an associated uncertainty, $\sigma_{k,t}^2(m)$ greater than a predetermined uncertainty threshold. The rejection of such bins can prevent estimates that are poor from affecting correction of the uncorrected IADC signal.

The time domain converter 70 can modify an estimate for $G_k(m)$ at the $0^{th}$ bin and a last bin, namely a bin at $f_s/2$ (e.g., $128^{th}$ bin) to reflect the fact that $h_i$ is a real filter. Once $h_i$ is a real filter, $G_2(0)$ and $G_2(128)$ are real, $G_3(0)=G_1*(0)$ and $G_3(128)=G_1*(128)$. These conditions can be imposed on the $G_k(m)$ estimates. The remaining tones can be linearly interpolated and extrapolated to generate an estimate of $G_k(m)$ for frequencies across a band of interest to generate an estimate for a continuous frequency domain mismatch profile, $G_k(f)$. In situations where only a single tone is present, linear interpolation can set a gain plus a delay mismatch estimation for each tone or some subset thereof.

In some examples, smoothing can be implemented with shaping filters for regions outside the band of interest to predetermined boundary conditions. For instance, at each band edge, samples are held for some tones and gradually tapered down (beyond the band of interest) to ensure less discontinuity for a last tone (e.g., a tone $f_s/2$, such as $128^{th}$ tone) in a first Nyquist frequency band, namely a signal frequency between 0 and $f_s/2$ for a sampling rate, $f_s$ of about 1 GHz. Additionally, smoothing can be implemented for both band edges, namely a first bin (e.g., the $0^{th}$ bin) at a first band edge and a last bin ($128^{th}$ bin) at a second band edge for a second Nyquist frequency band (between $f_s/2$ to $f_s$) and a third Nyquist frequency band ($f_s$ to $3f_s/3$), etc. Moreover, in mixed mode, wherein input tones have different Nyquist frequency bands, but upon sampling, the input tones occupy distinct spectra and do not overlap, smoothing can be implemented on both the $0^{th}$ bin and the last bin. This smoothing can also ensure smooth frequency response to attain improved fidelity when converting to the time domain. In other examples, regions outside of the band of interest can be ignored (e.g., don't-care terms).

Upon completing the interpolation and the smoothing (in some situations), in some examples, the time domain converter 70 can employ Equation 22 to the convert continuous frequency domain mismatch profile, $G_k(f)$ into a frequency domain filter function, $H_i(f)$. Further, the frequency domain filter function $H_i(f)$ can be converted into time domain filter coefficients, $h_i(m)$ via an IFFT function or a least squares fit over a desired band.

$$H_i(f) = \sum_{k=0}^{M-1} G_k(f) j^{ik} \qquad \text{Equation 22}$$

wherein:

$H_0(f)=0$.

In other examples, the time domain converter 70 can convert each value of the frequency domain profile estimate, $G_k(m)$ into a time domain function of a filter, $g_k(m)$ by employing an Inverse Fast Fourier Transform (IFFT). Additionally, the time domain converter 70 can convert the time domain filter functions $g_k(m)$ into filter coefficients $h_i(m)$ by employing Equation 23.

$$h_i(m) = \sum_{k=0}^{M-1} g_k(m) e^{\frac{j2\pi ik}{M}}, \text{ for all } m \qquad \text{Equation 23}$$

In either situation, the filter coefficients, $h_i(m)$ can be provided to time domain corrector 72 that can receive the uncorrected IADC signal from the interleaved ADC 52. The time domain corrector 72 can employ the filter coefficients, $h_i(m)$ in correction filters to subtract the images of the tone caused by the interleaving of the M number of ADCs 54 and output a corrected IADC output (labeled in FIG. 2 as "IADC OUTPUT").

Figure 6:
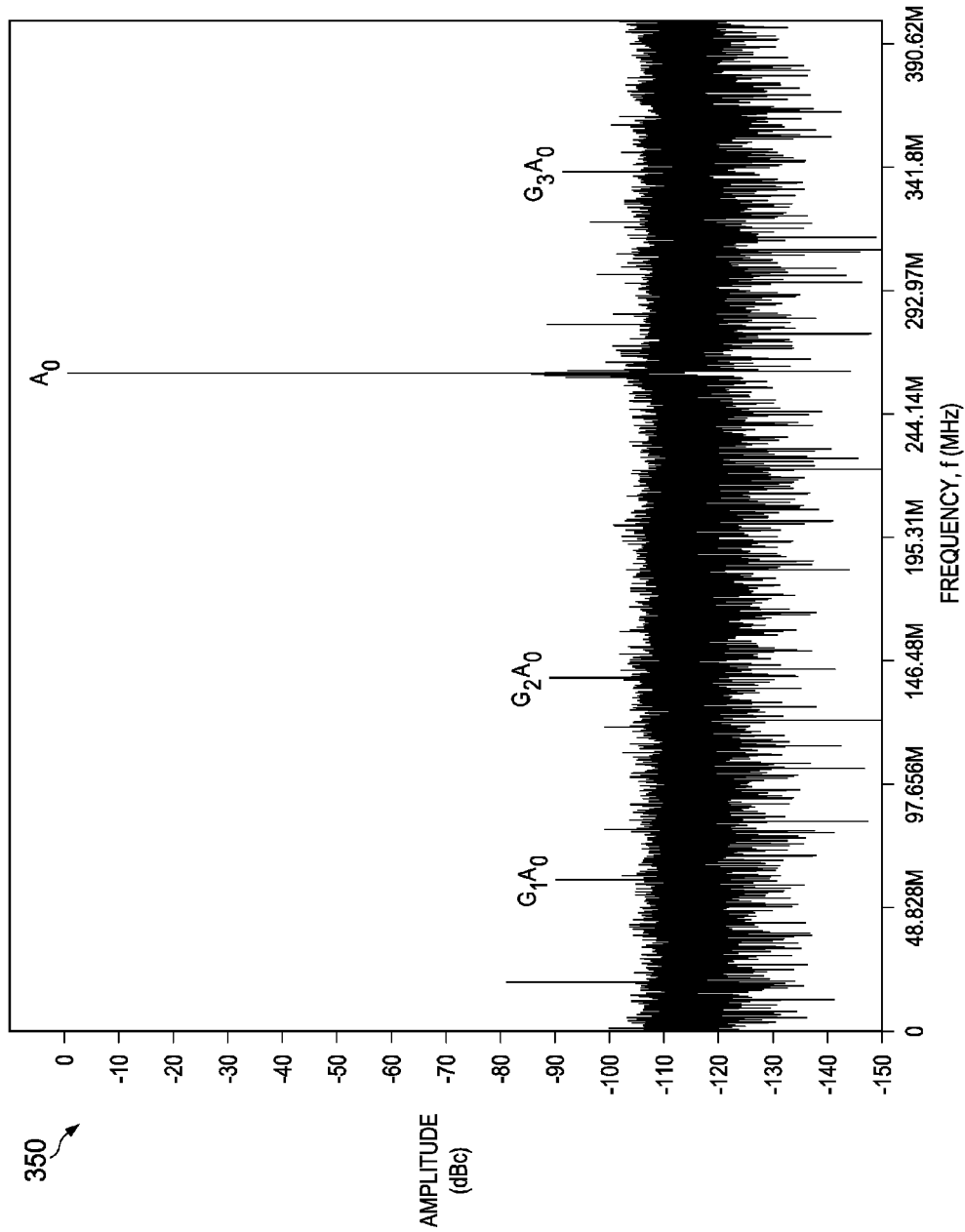
FIG. 6 illustrates an example of a graph depicting an output of an interleaved ADC with mismatch correction applied.

FIG. 6 illustrates an example of a graph 350 depicting a corrected IADC output represented in the given example, which corresponds to a corrected version of the graph 100 illustrated in FIG. 3. In the graph 350, amplitude of a signal, in dBc is plotted as a function of a frequency in MHz. As illustrated in the graph 350, in comparison to the graph 100, the complex amplitude of the images of the tones $G_1A_0$, $G_2A_0$ and $G_3A_0$ generated from mismatches are reduced, thereby increasing the overall performance of the interleaved ADC 52 illustrated in FIG. 2.

By employing the system 50, a blind estimation (e.g., no training signal) of mismatch profile between the M number of ADCs 54 can be achieved. Additionally, the mismatch profile between the M number of ADCs 54 can be determined in a non-parameterized fashion. That is, the mismatch profile estimated by the system 50 does not require parameters for gain, sampling time instant, bandwidth and/or additive mismatches of the M number of ADCs 54.

Figure 7:
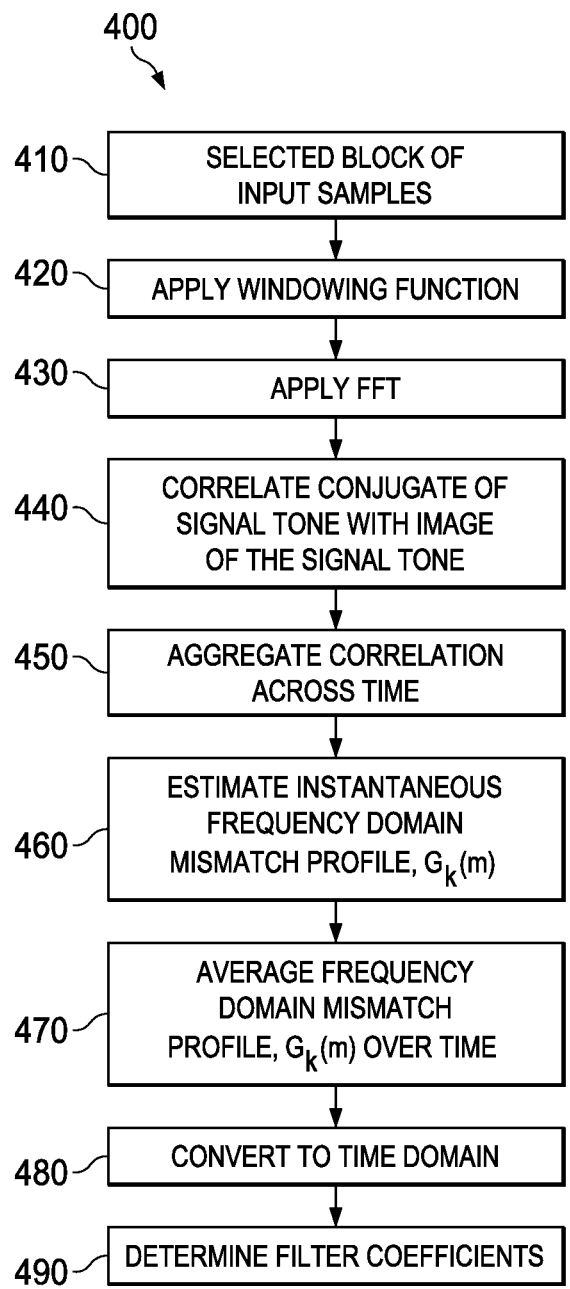
FIG. 7 illustrates an example of a method for determining a mismatch profile of an interleaved ADC.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 7 can be implemented as instructions stored in an IC chip (e.g., as firmware) that are executable by a processor (e.g., a microcontroller) and/or as logic (e.g., an FPGA).

FIG. 7 illustrates an example of a method 400 that could be implemented, for example by the system 2 of FIG. 1 and/or the system 50 of FIG. 2. At 410, a frequency domain processor (e.g., the frequency domain processor 8 of FIG. 1) can select a block of input samples from an uncorrected IADC signal. At 420, the frequency domain processor can apply a windowing function to the selected blocks of input samples. At 430, the frequency domain processor can apply an FFT to convert the windowed and selected blocks into the frequency domain.

At 440, a mismatch profile estimator (e.g., the mismatch profile estimator 10 of FIG. 1) can correlate the conjugate of a signal tone with an appropriate an image of the signal tone to obtain a correlation. At 450, the mismatch profile can aggregate the correlation across time to aggregate data. At 460, the mismatch profile estimator can estimate an instantaneous frequency domain mismatch profile, $G_k(m)$. At 470, the mismatch profile estimator can average multiple instances of the instantaneous frequency domain mismatch profile, $G_k(m)$ over time. In some examples, the averaging can include rejecting a particular bin of the domain mismatch profile, $\hat{G}_{k,t}(m)$ from further processing if that particular bin of the frequency domain mismatch profile $\hat{G}_{k,t}(m)$ has an uncertainty, $\sigma_{k,t}^2(m)$ greater than an uncertainty threshold.

At 480, a time domain converter (e.g., the time domain converter 12 of FIG. 1) can convert the frequency domain mismatch profile, $G_k(m)$ to the time domain to form a time domain mismatch profile, $g_k(m)$. At 490, the time domain converter can determine filter coefficients, $h_t(m)$ based on the time domain mismatch profile, $g_k(m)$. The filter coefficients can be employed to correct the IADC signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
   a signal image correlator receives a discrete frequency domain representation of a signal tone in an interleaved analog-to-digital (IADC) signal and an image of the signal tone in the discrete frequency domain representation of the IADC signal and determines a correlation between the signal tone and the image of the signal tone, a power of the signal tone and a power of the image of the signal tone;
   a frequency domain estimator determines an instantaneous frequency domain mismatch profile estimate based on the correlation between the signal tone and the image of the signal tone;
   an averaging filter averages the instantaneous frequency domain mismatch profile estimate over time to provide a frequency domain mismatch profile estimate; and
   a time domain converter converts the frequency domain mismatch profile estimate into the time domain.

2. The system of claim 1, further comprising:
   an interleaved analog-to-digital converter (ADC) comprising component ADCs, the interleaved ADC outputs the IADC signal, wherein the IADC signal comprises spurious signals generated from mismatches in the component ADCs.

3. The system of claim 1, wherein the time domain converter interpolates and extrapolates the frequency domain mismatch profile across a band of interest and applies a smoothing function to gradually taper down values for the frequency domain mismatch profiles outside of the band of interest.

4. The system of claim 1, further comprising an FFT data selector configured to:
   receive the IADC signal; and
   apply a windowing function to the IADC signal to provide selected blocks of data corresponding to an interval of the IADC signal.

5. The system of claim 4, further comprising a frequency domain converter to apply a validity check on the selected blocks of data and reject the selected blocks that have a predetermined number of samples that are greater than a saturation threshold and to reject the selected blocks that have an overall power less than a power threshold to form a non-rejected set of blocks that correspond to the discrete frequency domain representation of the IADC signal.

6. The system of claim 4, wherein the frequency domain converter converts the non-rejected selected blocks of data corresponding to the IADC signal into the frequency domain using a Fast Fourier Transform (FFT) to provide the discrete frequency domain representation of the IADC signal.

7. The system of claim 1, further comprising an aggregator that rejects signal tones that have a power less than a threshold level to reduce uncertainty in the instantaneous frequency domain mismatch profile estimate.

8. The system of claim 7, wherein the aggregator rejects signal-image pair of the discrete frequency domain representation of the IADC signal that contain tones with a signal-to-image power ratio less than another threshold level to further reduce uncertainty in the instantaneous frequency domain mismatch profile estimate.

9. The system of claim 1, further comprising an aggregator that aggregates the correlation, the power of the signal tone and the power of the image of the signal tone over time and provide aggregated statistics to the frequency domain estimator to reduce uncertainty in the instantaneous frequency domain mismatch profile estimate.

10. The system of claim 9, wherein the aggregator detects a presence of a tone of a given signal and an image of another signal that is at substantially the same frequency.

11. The system of claim 1, wherein the frequency domain estimator determines an uncertainty of the instantaneous frequency domain mismatch profile estimate.

12. The system of claim 1, wherein the averaging filter comprises a Kalman filter to compute the frequency domain mismatch profile estimate recursively based on at least one past instantaneous frequency domain mismatch profile estimate.

13. The system of claim 1, wherein the averaging filter comprises an infinite impulse response filter.

14. An integrated circuit (IC) chip comprising the system of claim 1.

15. An integrated circuit (IC) chip comprising:
   an interleaved analog-to-digital converter (ADC) comprising a plurality of ADCs that are each configured to sample an analog signal in response to a clock pulse, wherein the interleaved ADC outputs an interleaved ADC (IADC) signal that comprises a plurality of spurious signals formed from mismatches between the plurality of ADCs;
   a frequency domain processor to apply the Fast Fourier Transform (FFT) on the IADC signal to generate a discrete frequency domain representation of the IADC signal;
   a mismatch profile estimator determines a frequency domain mismatch profile estimate for the IADC signal based on the discrete frequency domain representation of the IADC signal; and
   a time domain converter converts the frequency domain mismatch profile estimate into the time domain.

16. The IC chip of claim 15, wherein the mismatch profile estimator averages a plurality of instantaneous frequency domain mismatch profile estimates over time.

17. The IC chip of claim 15, wherein the mismatch profile estimator rejects bins of the discrete frequency domain representation of the IADC signal that have power below a threshold to reduce an uncertainty of the frequency domain mismatch profile estimate.

18. The IC chip of claim 15, wherein the frequency domain mismatch profile estimate characterizes at least a gain mismatch, a bandwidth mismatch and a sampling instant mismatch between the plurality of ADCs of the interleaved ADC.

19. A method comprising:
applying a windowing function to selected blocks of samples of an interleaved analog-to-digital (IADC) signal;
applying a Fast Fourier Transform (FFT) to the windowed selected blocks of samples to determine a discrete frequency domain representation of the IADC signal;
correlating a conjugate of a tone in the discrete frequency domain representation of the IADC signal to determine a correlation between the tone and an image of the tone;
estimating an instantaneous frequency domain mismatch profile based on the correlation between the tone and the image of the tone; and
averaging a plurality of instances of the instantaneous frequency domain mismatch profile over time to determine a frequency domain mismatch profile estimate.

20. The method of claim 19, wherein the averaging comprises rejecting a given bin of the frequency domain mismatch profile estimate from further processing in response to determining that the given bin of the frequency domain mismatch profile estimate has an uncertainty greater than an uncertainty threshold.

* * * * *